(12) United States Patent
Gorin et al.

(10) Patent No.: US 6,370,484 B1
(45) Date of Patent: Apr. 9, 2002

(54) SIGNAL ANALYZER HAVING INDEPENDENT ANALYSIS AND DISPLAY SCALES

(75) Inventors: Joseph M Gorin, Santa Rosa, CA (US); David D Sharrit, Phoenix, AZ (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/513,715

(22) Filed: Feb. 25, 2000

(51) Int. Cl.$^7$ .............................................. G01R 23/00
(52) U.S. Cl. ...................... 702/66; 702/76; 324/76.19
(58) Field of Search .............................. 702/66, 67, 70, 702/71, 73, 76; 324/76.11, 76.19, 76.22

(56) References Cited

U.S. PATENT DOCUMENTS

| | | | | |
|---|---|---|---|---|
| 4,703,433 A | * | 10/1987 | Sharrit | ........................ 364/485 |
| 5,576,978 A | * | 11/1996 | Kitayoshi | ................. 324/76.19 |
| 6,208,944 B1 | * | 3/2001 | Franke et al. | ................ 340/680 |

OTHER PUBLICATIONS

Hewlett–Packard Company—Spectrum Analyzer Measurements and Noise—Application Note 1303; "Measuring Noise and Noise–Like Digital Communications Signals With a Spectrum Analyzer" pp. 1–31.

Rohde & Schwarz—Test and Measurement Division; "Operating Manual—Spectrum Analyzer"; 1065.6000–2.2–9,2.2–15, 2.9–74–E–8.

* cited by examiner

*Primary Examiner*—Patrick Assouad
(74) *Attorney, Agent, or Firm*—John L. Imperato

(57) ABSTRACT

A signal analyzer has an analysis scale and a display scale that are independently selectable. The signal analyzer receives a first representation of an applied signal and provides from the first representation at least two alternative representations. A first selective input enables a designated one of the alternative representations to be applied to a filter to reduce variance of the designated representation. The signal analyzer then converts the received one of the alternative representations having reduced variance to at least two alternative display scales. A second selective input enables a designated one of the alternative display scales to be displayed on a monitor, display screen or other output device of the measurement instrument or system. Independent control of the first selective input and the second selective input via a user interface enables the analysis scale—the scale, or representation, to which the filter is applied, to be selected independently of the scale on which the representation having reduced variance is displayed.

20 Claims, 2 Drawing Sheets

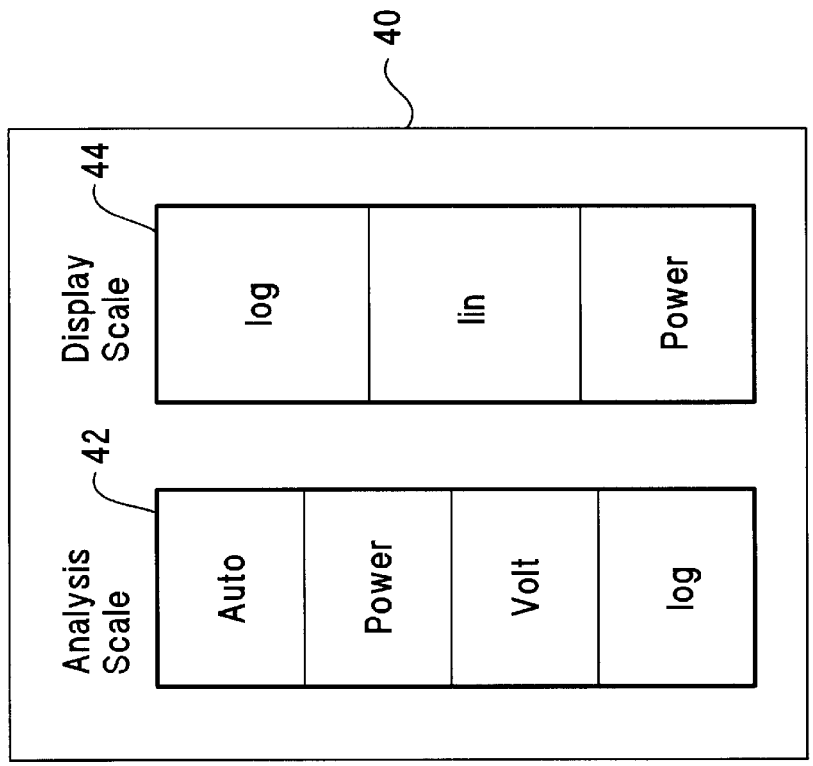
*Figure 3*
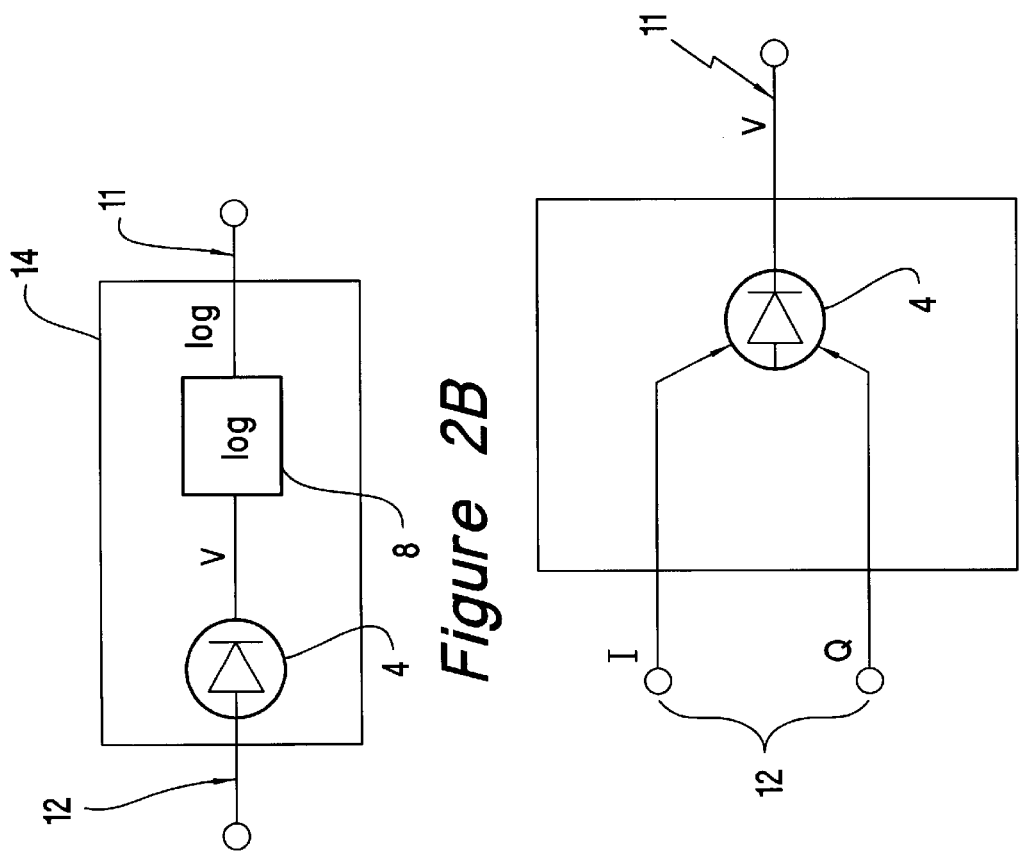
*Figure 2B*
*Figure 2A*

SIGNAL ANALYZER HAVING INDEPENDENT ANALYSIS AND DISPLAY SCALES

BACKGROUND OF THE INVENTION

Measurement instruments, such as spectrum analyzers and network analyzers, employ video bandwidth filtering, averaging and other types of signal conditioning to improve measurements of applied signals. For example, video bandwidth filtering within a spectrum analyzer decreases measurement variance when signals are measured in the presence of noise. Video bandwidth filtering of a signal is most advantageous when the signal is represented using an analysis scale that is most appropriate to the nature of the applied signal. When the applied signal is a continuous-wave signal, the effect of noise is minimized when video bandwidth filtering is performed with the signal represented on a first analysis scale—the logarithmic scale. When the applied signal is a pulsed radio frequency (RF) signal, the measurement of the pulse envelope shape of the signal is most accurately obtained when video bandwidth filtering is performed with the signal represented on a second analysis scale—the linear, or voltage, scale. When the applied signal is from a communication network having spectrally separated channels, adjacent channel power measurements are most accurately obtained when video bandwidth filtering is performed with the signal represented on a third analysis scale—the power scale. The effect of noise on spectrum analyzer measurements is discussed in Hewlett-Packard Company's Application Note 1303, Spectrum Analyzer Measurements and Noise.

While the effect of noise on measurements within a measurement instrument can be reduced by selecting the analysis scale most appropriate to the nature of the applied signal, the scale on which the signal is preferably displayed, the display scale, does not always correspond to the selected analysis scale. For example, since the pulse envelope shape of a pulsed RF signal is most accurately measured when video bandwidth filtering is performed on the voltage scale, the preferred analysis scale for this signal is the voltage scale. However, to achieve enough dynamic range to observe the on/off ratio of the pulse envelope on a display screen, monitor, or other output device, a logarithmic display scale is preferable. In this example, the voltage scale is the preferred analysis scale, whereas the preferred display scale is the logarithmic scale. In other circumstances, the preferred analysis scale is also different from the preferred display scale, depending on the nature of the applied signal and the characteristics of the signal that are sought to be displayed.

Presently available measurement instruments having analysis scales that are coupled to the display scales are unable to filter a representation of an applied signal on a scale that is independent of the scale on which the signal is displayed. Accordingly, there is a need for an instrument or system having analysis scale and display scale that are independently selectable.

SUMMARY OF THE INVENTION

A signal analyzer constructed according to the preferred embodiment of the present invention has an analysis scale and a display scale that are independently selectable. The signal analyzer, included within a spectrum analyzer, network analyzer or other measurement instrument or system, receives a first representation of an applied signal. From the first representation of the applied signal, the signal analyzer provides at least two of a second representation, third representation and a fourth representation, the third representation being a square of the second representation, and the fourth representation being logarithmically related to the second representation and the third representation. The second, third and fourth representations correspond to alternative analysis scales, such as the voltage scale, the power scale and the logarithmic scale, respectively. A first selective input enables a designated one of the at least two representations to be applied to a filter to reduce variance of that designated representation. The signal analyzer then converts the filtered representation to at least two of a fifth, sixth and seventh representation, the sixth representation being a square of the fifth representation, and the seventh representation being logarithmically related to the fifth representation and the sixth representation. The fifth, sixth and seventh representations correspond to alternative display scales, such as the voltage scale, power scale and logarithmic scale, respectively. A second selective input enables a designated one of the fifth, sixth and seventh representations to be displayed on a monitor, display screen or other output device of the measurement instrument or system.

Independent control of the first selective input and the second selective input enables the analysis scale—the scale to which the filter is applied, to be selected independently of the scale on which the representation having reduced variance is displayed. A user interface provides for independent control of the first selective input and the second selective input using scale selection menus. The scale selection menus provide for optional coupling between the first selective input and the second selective input according to predefined coupling rules.

BRIEF DESCRIPTION OF THE DRAWINGS

FIGS. 2A and 2B show alternative input blocks for use with the signal analyzer constructed according to the preferred embodiment of the present invention.

FIG. 3 shows a user interface for use with the signal analyzer constructed according to the preferred embodiment of the present invention.

DETAILED DESCRIPTION OF THE PREFERRED EMBODIMENT

Figure 1:
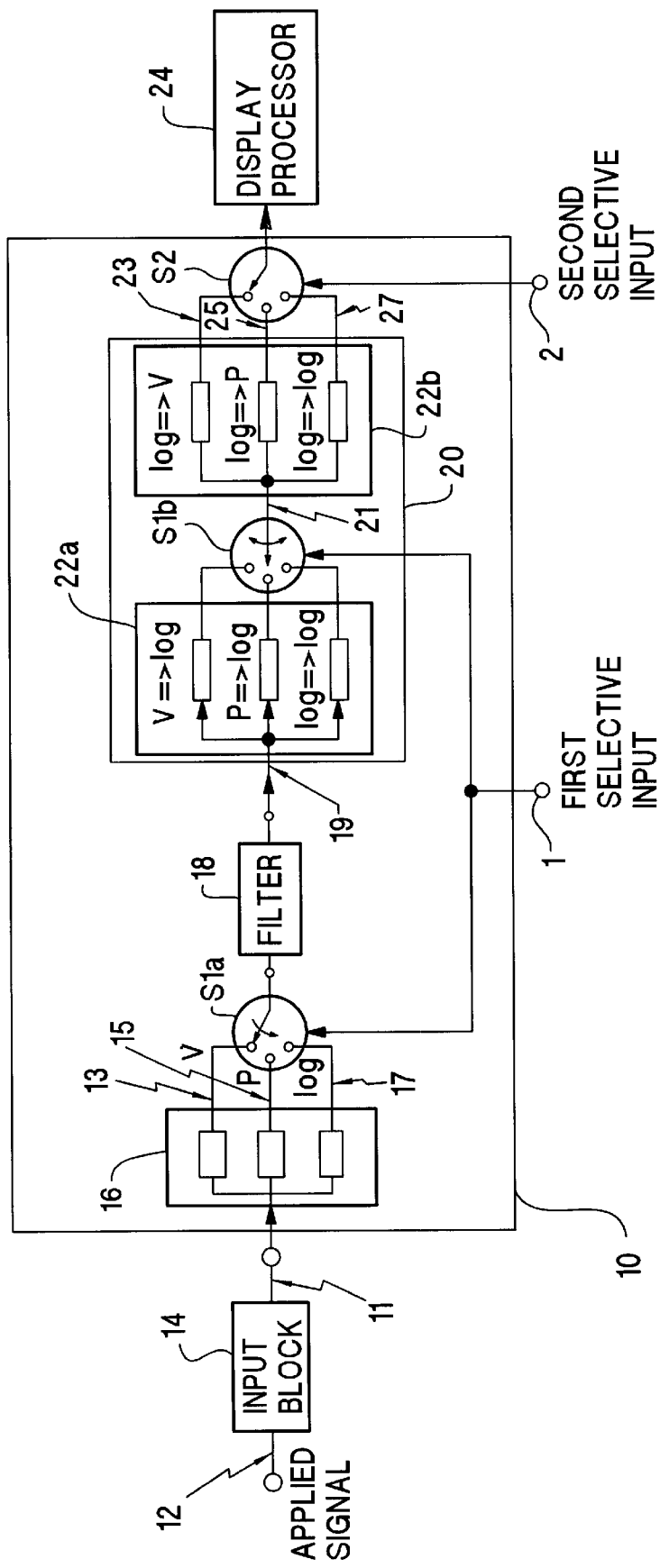
FIG. 1 is a functional diagram of the signal analyzer constructed according to the preferred embodiment of the present invention.

FIG. 1 is a functional diagram of the signal analyzer 10 constructed according to the preferred embodiment of the present invention. Typically, the signal analyzer 10 is included within a spectrum analyzer, network analyzer or other measurement instrument or system. The functional elements of the signal analyzer 10 are implemented using analog or digital hardware, firmware, embedded software, digital hardware, digital signal processors (DSPs), or a combination of these technologies.

The signal analyzer 10 receives a representation 11 of an applied signal 12 from an input block 14. FIG. 2A and FIG. 2B show alternative examples of input blocks 14 for use with the signal analyzer 10. In FIG. 2A, the input block 14 includes a detector 4. The detector 4 extracts the envelope of the applied signal 12. The input block 14 of FIG. 2A is typically used when the applied signal 12 consists of an in-phase signal component I and a quadrature signal component Q. The extracted envelope produces a representation 11 that is the magnitude of the applied signal 12 on a linear, or voltage, scale. In FIG. 2B, the input block 14 includes a detector 4 and a logarithmic converter 6. The input block 14 of FIG. 2B is typically used when the applied signal 12 is an intermediate frequency signal. The detector 4 extracts the envelope of the applied signal 12. The extracted envelope is a representation of the applied signal 12 on a linear, or voltage, scale. The logarithmic converter 6 converts the linear representation to a representation 11 of the applied signal 12 that is on the logarithmic scale. Although the detector 4 and logarithmic converter 6 are readily implemented using analog hardware, modern measurement instruments and systems typically employ a digital implementation of the detector 4 and logarithmic converter 6 in a DSP.

A first processor 16 within the signal analyzer 10 converts the representation 11 received from the input block 14 into at least two different representations. In this example, the first processor 16 is shown converting the first representation 11 of the applied signal 12 into three different representations, a voltage representation 13, a power representation 15 and a logarithmic representation 17. The power representation 15 has a square relationship to the voltage representation 13. The logarithmic representation 17 has a logarithmic relationship to the voltage representation 13, and therefore, also has logarithmic relationship to the power representation. Alternatively, the first processor 16 provides only two different representations from the representation 11 of the applied signal 12, such as a voltage representation 13 and a power representation 15, a voltage representation 13 and a logarithmic representation 17, or a power representation 15 and a logarithmic representation 17. The first processor 16 can also provide additional representations to the voltage representation 13, the power representation 15, and the logarithmic representation 17 to those shown in FIG. 1.

When the representation 11 provided by the input block 14 is on a voltage scale, the voltage representation 13 is provided by a voltage-to-voltage conversion path (not shown) within the first processor 16, the power representation 15 is provided by a voltage-to-power conversion path (not shown) within the first processor 16, and the logarithmic representation 17 is provided by a voltage-to-logarithmic conversion path (not shown) within the first processor 16. When the representation 11 provided by the input block 14 is on a logarithmic scale, the voltage representation 13 is provided by a logarithmic-to-voltage conversion path (not shown) within the first processor 16, the power representation 15 is provided by a logarithmic-to-power conversion path (not shown) within the first processor 16, and the logarithmic representation 17 is provided by a logarithmic-to-logarithmic conversion path (not shown) within the first processor 16.

A first selective input 1 drives a switch S1a and enables a designated one of the at least two representations provided by the first processor 16 to be applied to a filter 18. The filter 18 is typically a video bandwidth filter, block averager or other type of signal conditioner. The filter 18 reduces the variance of the one of the representations 13, 15, 17 that is applied to the filter 18 on the scale corresponding to the representation. For example, when the voltage representation 13 is applied to the filter 18, the filter 18 reduces the variance of the voltage representation 13 on the voltage scale. When the power representation 15 is applied to the filter 18, the filter 18 reduces the variance of the power representation 15 on the power scale. When the logarithmic representation 17 is applied to the filter 18, the filter 18 reduces the variance of the logarithmic representation 17 on the logarithmic scale.

Since time delays are introduced by the filter 18, parameters of the filter are chosen so that the variance is sufficiently reduced without introducing unduly large time delays. Typically, parameters of the filter 18, such as the video bandwidth filter or the number of averages performed by a block averager, are adjustable.

A second processor 20, coupled to the output of the filter 18 receives the filtered, or otherwise conditioned, signal 19 from the filter 18. A first converter 22a within the second processor 20 converts the signal 19 from the corresponding scale into a logarithmic scale. For example, when the signal 19 results from application of the voltage representation 13 to the filter 18, the converter 22a converts the signal 19 from the voltage scale to the logarithmic scale, as shown by the v=>log conversion path within converter 22a. When the signal 19 results from application of the power representation 15 to the filter 18, the converter 22a converts the signal 19 from the power scale to the logarithmic scale, as shown by the p=>log conversion path within converter 22a. When the signal 19 results from application of the logarithmic representation 17 to the filter 18, the converter 22a maintains the signal 19 in the logarithmic scale, as shown by the log=>log conversion path within converter 22a. The first selective input 1, which designates which one of the representations 13, 15, 17 is applied to the filter 18, also drives a switch S1b to designate which of the conversion paths v=>log, P=>log, log=>log within the converter 22a is applied to the signal 19.

A second converter 2b within the second processor 20 receives a logarithmic representation 21 of the signal 19 that is on the logarithmic scale and provides conversion from the logarithmic representation 21 on the logarithmic scale to at least two different scales. In this example, the second converter 2b is shown converting the logarithmic representation 21 into three different representations, or scales, a representation on the voltage scale 23 resulting from the log=>v conversion path, a representation on the power scale 25 resulting from the log=>p conversion path, and a representation on the logarithmic scale 27 resulting from the log=>log conversion path. A second selective input 2 drives a switch S2 and enables a designated one of the at least two scales 23, 25, 27 provided by the second converter 2b to be applied to a display processor 24. The display processor 24 used with the signal analyzer 10 typically includes a display screen, monitor or other output device. Trace averaging, trace manipulation, marker designations and other processing functions (not shown) may also be included in the display processor 24. The second processor 20 shown in FIG. 1 includes a first converter 22a that provides conversion paths v=>log, p=>log, log=>log to the logarithmic scale and a second converter 2b that provides conversion paths log=>v, log=>p, log=>log from the logarithmic scale. Alternatively, the first converter 22a and the second converter 2b provide conversion paths to and from a voltage scale, a power scale, or other designated scales.

The first selective input 1 and the second selective input 2 are independently controlled. Alternatively, control of the first selective input and the second selective input is coupled according to optionally implemented coupling rules. FIG. 4 shows a user interface 40 for controlling the first selective input 1 and the second selective input 2 within the signal analyzer 10. An analysis scale menu 42 of the interface 40 provides control of the first selective input 1. A display scale menu 44 in the interface 40 provides control of the second selective input 2. Menu 42 and menu 44 are typically nested within other menu options in a user interface of a measurement instrument or system in which the signal analyzer 10 is included.

The analysis scale menu 42 has at least two different selection alternatives, or options, that correspond to the different representations provided by the first processor 16. In this example, since the first processor 16 as shown in FIG. 1 provides a voltage representation 13, a power representation 15, and a logarithmic representation 17, the analysis scale menu 42 includes at least three selection alternatives. A VOLT menu selection alternative, coupled to the first selective input 1, drives switch S1a so that the voltage representation 13, provided by the first processor 16, is coupled to the filter 18. The VOLT menu selection alternative also drives switch S1b so that the v=>log conversion path within the first converter 22a is coupled to the second converter 2b. A POWER menu selection alternative, coupled to the first selective input, drives switch S1a so that the power representation 15, provided by the first processor 16, is coupled to the filter 18. The POWER menu selection alternative also drives switch S1b so that the p=>log conversion path within the first converter 22a is coupled to the second converter 2b. A LOG menu selection alternative, coupled to the first selective input, drives switch S1a so that when the LOG alternative is enabled, the logarithmic representation 17, provided by the first processor 16, is coupled to the filter 18. The LOG menu selection alternative also drives switch S1b so that the log=>log conversion path within the first converter 22a is coupled to the second converter 2b.

The display scale menu 44 has at least two different selection alternatives, or options, corresponding to the different scales 23, 25, 27 provided by the second converter 2b within the second processor 20. In this example, since the second processor 20 provides a voltage scale 23, a power scale 25, and a logarithmic scale 27, the display scale menu 44 includes three selection alternatives. A LIN menu selection alternative on the display scale menu 44, coupled to the second selective input 2, drives switch S2 so that the voltage scale 23, provided by the second processor 20, is coupled to the display processor 24. A POWER menu selection alternative on the display scale menu 44, coupled to the second selective input 2, drives switch S2 so that the power scale 25, provided by the second processor 20, is coupled to the display processor 24. A LOG menu selection alternative on the display scale menu 44, coupled to the second selective input 2, drives switch S2 so that the logarithmic scale 27, provided by the second processor 20, is coupled to the display processor 24.

The analysis scale menu 42 shown in FIG. 4 includes an optional AUTO menu selection alternative. When the AUTO selection alternative is enabled, the first selective input 1 and the second selective input 2 are coupled according to predefined coupling rules. A default coupling, results in coupling of the analysis scale to the display scale so that the analysis scale automatically tracks the enabled one of the display scale menu selection alternatives. This default coupling can be modified according to designated operating conditions of the measurement instrument or system in which the signal analyzer 10 is included. As an example, the default coupling can be modified when a noise marker within the instrument or system is invoked, or when band power markers are invoked, so that the power representation 15 is coupled to the filter 18. Other instrument conditions can also be designated to modify the default coupling. The coupling rules are defined to include the default coupling, or alternatively, the default coupling in combination with modifications according to operating conditions of the instrument or system in which the signal analyzer 10 is included. When the optionally included AUTO selection alternative is not enabled, the first selective input 1 and the second selective input 2 are independently controlled according to the enabled selection alternatives on each of the analysis scale menu 42 and the display scale menu 44.

While the preferred embodiment of the present invention has been illustrated in detail, it should be apparent that modifications and adaptations to this embodiment may occur to one skilled in the art without departing from the scope of the present invention as set forth in the following claims.

What is claimed is:

1. A signal analyzer, comprising:
    a first processor receiving a first representation of an applied signal, and providing from the first representation at least two of a second representation, a third representation having a square relationship to the second representation, and a fourth representation having a logarithmic relationship to the second representation and the third representation;
    a filter receiving one of the second representations, the third representations and the fourth representations from the first processor selected according to a first input and reducing the variance of the received one of the representations;
    a second processor coupled to the filter and to a display processor, converting the received one of the second representation, third representation and fourth representation having reduced variance to at least two of a fifth representation, a sixth representation having a square relationship to the fifth representation, and a seventh representation having a logarithmic relationship to the fifth representation and the sixth representation and coupling to the display processor at least one of the fifth representation, the sixth representation, and the seventh representation according to a second input, wherein the first input and the second input are independently controlled.

2. The signal analyzer of claim 1 further comprising a first menu controlling the first selective input and a second menu controlling the second selective input.

3. The signal analyzer of claim 2 wherein the first menu includes at least two of a voltage option for designating the second representation to be received by the filter, a power option for designating the third representation to be received by the filter, and a logarithm option for designating the fourth representation to be received by the filter.

4. The signal analyzer of claim 2 wherein the second menu includes at least two of a linear option that couples the fifth representation to the display processor, a power option that couples the sixth representation to the display processor and a logarithm option that couples the seventh representation to the display processor.

5. The signal analyzer of claim 4 wherein the second menu includes at least two of a linear option that couples the fifth representation to the display processor, a power option that couples the sixth representation to the display processor and a logarithm option that couples the seventh representation to the display processor.

6. The signal analyzer of claim 1 wherein the first selective input and the second selective input are optionally coupled according to predefined rules.

7. The signal analyzer of claim 6 wherein the predefined rules include default coupling of the first input to the second input.

8. The signal analyzer of claim 1 wherein the first representation is an envelope of the applied signal on a voltage scale.

9. The signal analyzer of claim 1 wherein the first representation is an envelope of the applied signal on a logarithmic scale.

10. A signal analyzer, comprising:
- a first processor receiving a first representation of an applied signal and providing from the first representation at least two alternative representations;
- a filter receiving the one of the at least two alternative representations from the first processor selected according to a first input, and reducing variance of the received one of the at least two alternative representations;
- a second processor coupled to the filter and a display processor, the second processor converting the received one of the at least two alternative representations having reduced variance, to at least two alternative display scales, one of the at least two alternative display scales being coupled to a display processor according to a second input, wherein the first input and the second input are independently controlled.

11. The signal analyzer of claim 10 wherein the at least two alternative representations provided from the first processor include at least two of a voltage representation, a power representation and a logarithmic representation.

12. The signal analyzer of claim 10 wherein the at least two alternative display scales include at least two of a voltage scale, a power scale and a logarithm scale.

13. The signal analyzer of claim 11 wherein the at least two alternative display scales include at least two of a voltage scale, a power scale and a logarithm scale.

14. The signal analyzer of claim 10 further comprising a user interface providing independent control of the first input and the second input.

15. The signal analyzer of claim 14 wherein the user interface further provides for optional coupling of the second input to the first input according to predefined coupling rules.

16. The signal analyzer of claim 14 wherein the user interface includes a first menu and a second menu.

17. The signal analyzer of claim 10 wherein the first representation is an envelope of the applied signal on a voltage scale.

18. The signal analyzer of claim 17 wherein the first processor includes at least two of a voltage-to-power converter, a voltage-to-voltage converter and a voltage-to-logarithm converter.

19. The signal analyzer of claim 10 wherein the first representation is an envelope of the applied signal on a logarithmic scale.

20. The signal analyzer of claim 19 wherein the first processor includes at least two of a logarithm-to-voltage converter, a logarithm-to-power converter, and a logarithm-to-logarithm converter.

* * * * *